United States Patent [19]

Reichmanis et al.

[11] 4,382,120

[45] May 3, 1983

[54] PHOTOSENSITIVE ELEMENT CONTAINING UV SENSITIVE TERPOLYMERS

[75] Inventors: Elsa Reichmanis, Piscataway; Cletus W. Wilkins, Jr., Plainfield, both of N.J.

[73] Assignee: Bell Telephone Laboratories, Incorporated, Murray Hill, N.J.

[21] Appl. No.: 347,483

[22] Filed: Feb. 10, 1982

Related U.S. Application Data

[62] Division of Ser. No. 236,114, Feb. 19, 1981, Pat. No. 4,343,889.

[51] Int. Cl.$^3$ .............................................. G03C 1/68
[52] U.S. Cl. .................................. 430/272; 430/270; 204/159.11; 204/159.14; 204/159.22; 526/311
[58] Field of Search .............. 430/270, 296, 302, 313, 430/311, 272; 204/159.11, 159.14, 159.22; 526/311

[56] References Cited

U.S. PATENT DOCUMENTS 3,558,311  1/1971  Delzenne et al. ................... 430/270
4,233,394  11/1980  Helbert .............................. 430/296
4,279,984  7/1981  Matsuda et al. ..................... 430/296

OTHER PUBLICATIONS

Reichmanis et al., Journal of the Electrochemical society, vol. 127, p. 2514.

*Primary Examiner*—Jack P. Brammer
*Attorney, Agent, or Firm*—Bruce S. Schneider

[57] ABSTRACT

A photolithographic resist with excellent sensitivity for actinic radiation in the short wavelength ultraviolet region is produced from terpolymers of (1) methyl methacrylate, (2) materials such as 3-oximino-2-butanone methacrylate, and (3) compounds such as methacrylonitrile.

10 Claims, No Drawings

PHOTOSENSITIVE ELEMENT CONTAINING UV SENSITIVE TERPOLYMERS

This is a division of application Ser. No. 236,114, filed Feb. 19, 1981, now U.S. Pat. No. 4,343,889.

BACKGROUND OF THE INVENTION

1. Field of the Invention

This invention relates to lithography and, more particularly, to photolithography.

2. Art Background

A variety of lithographic processes are presently used in the fabrication of semiconductor devices. In particular, a common lithographic technique is to employ light to expose an organic polymer that has been coated on a substrate such as a silicon wafer. The polymer is formulated so that the regions exposed to light undergo a chemical reaction. For positive resists, the chemical reaction results in a compound in the exposed regions that has, in an appropriate solvent, a significantly greater solubility than the original polymer. The pattern delineated in the polymer is developed by using this solvent to dissolve the exposed regions while leaving essentially unaffected the portions of the resist that have not been subjected to actinic radiation.

The resolution attained is affected by the wavelength of the exposing radiation. Generally, the shorter the wavelength of the exposing radiation, the better the resolution that is ultimately achievable. Therefore, extensive research has centered on the formulation of resists that are suitable for exposure by short wavelength ultraviolet light, i.e., by light in the wavelength range between 200 nm to 300 nm.

Generally, for a resist material to be appropriate for ultraviolet lithography, it should have a relatively high sensitivity to ultraviolet radiation, i.e., should require less than 200 millijoules per $cm^2$ of incident short wavelength ultraviolet light to form the desired image. The requisite of high sensitivities is necessitated by practical consideration. Generally, useful sources of short wavelength ultraviolet radiation generate a relatively low intensity. Thus, to attain adequate exposure during a time period acceptable for most applications, a material with relatively high sensitivity to ultraviolet radiation should be utilized.

A variety of attempts have been made to produce materials that are patternable by exposure to ultraviolet radiation. For example, U.S. Pat. No. 3,558,311, issued Jan. 26, 1971, describes the solution degradation of a few copolymers of methyl methacrylate and 3-oximino-2-butanone methacrylate (OBM). Additionally, poly(methyl methacrylate) (PMMA) is also known to absorb in the short wavelength ultraviolet. These polymers have a non-negligible absorption coefficient in the ultraviolet region. However, the sensitivity of PMMA to short wavelength ultraviolet radiation is unacceptable and the liquid phase experiments done with the copolymers yielded no information concerning the solid phase characteristics such as sensitivity and resolution.

The absence of disclosures concerning a sensitive UV resist is indicative of the difficulty in developing such a resist. The sensitivity of a resist to a given exposing radiation depends on the change in solubility produced in the exposed region of the film through an induced chemical reaction. Although certain organic functional groups are known to absorb in the UV, the resulting chemical transformation(s) in the solid state of molecules having these groups is a complex and uncertain matter. Therefore, although generally it is determinable whether a material will absorb in the UV, it is not predictable how the compound will be altered or what the change in solubility will be as a result of this absorption. Thus, resists absorbing short wavelength ultraviolet radiation have been developed, but resists with relatively high sensitivities are typically not available.

SUMMARY OF THE INVENTION

Photosensitive bodies based on resists that absorb in the UV and that have a sensitivity to short wavelength UV light up to 20 millijoules per $cm^2$ at 240 nm are producible. The resists include terpolymers formed from a composition such as methyl methacrylate that is polymerized with an OBM based compound and with an acrylonitrile based compound. For example, a polymer that is formed from 79% methyl methacrylate, 6% OBM, and 15% methacrylonitrile exhibits a sensitivity approximately 10 times greater than poly(methyl methacrylate) at 240 nm while allowing the formation of patterns with dimensions as small as 1 $\mu$m. Threefold improvements are also achieved over corresponding copolymers of methyl methacrylate and OBM without the methacrylonitrile. The UV sensitive bodies are produced by coating the resist on a substrate, such as a silicon wafer. It is then possible to delineate the resist in a pattern suitable for use in device fabrication with practical exposure times with commonly available sources.

DETAILED DESCRIPTION

Photosensitive bodies are produced by coating a resist material onto a substrate such as a semiconductor body, e.g., a silicon wafer. This coating is done by dissolving a photosensitive material such as a photosensitive polymer into a suitable solvent which is employed to deposit the polymer onto a substrate by conventional techniques such as spinning. In spinning, the dissolved polymer is coated onto the wafer and the wafer is then rotated. This procedure results in a relatively uniform layer of the polymer. (See DeForest, *Photoresist Materials and Processes*, page 223, 1975, McGraw-Hill, for a general description of the spinning procedure.)

By using a specific class of polymers, a photosensitive body, i.e., bodies with sensitivities up to 20 millijoules per $cm^2$ at 240 nm are producible. This class of materials encompasses polymers formed from three monomers—(1) a methacrylate ester compound, i.e.,

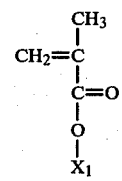

where $X_1$ is an alkyl, preferably a methyl, (2) an OBM based compound, i.e.,

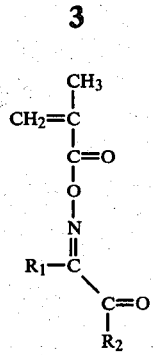

where $R_1$ is methyl, ethyl, or propyl, $R_2$ is methyl, ethyl, or propyl, or $R_1$ and $R_2$ are connected to form 5 or 6 member carbocylic rings, such as

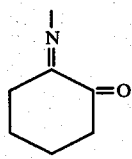

and (3) an acrylonitrile based compound, i.e.,

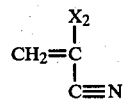

where $X_2$ is $CH_3$ or Cl. The $X_1$ group strongly affects the glass transition temperature of the final polymer. An $X_1$ that yields a polymer that is too soft, i.e., a polymer with a glass transition temperature below 90 degrees C., limits the dimensional stability and, thus, the resolution. For typical monomer combinations, $X_1$ is preferably chosen to be a methyl radical.

The desired polymers are prepared from the monomers by conventional polymerization techniques. For example, the monomers (together with a catalyst if used) are mixed in a solvent, e.g., toluene, ethyl acetate, or acetone. The mixture is then agitated at a temperature in the range 60 to 130 degrees C. Temperatures higher than 130 degrees C. generally induce excessive decomposition of the OBM monomer. Temperatures lower than 60 degrees C. are employable and are not precluded. However, lower temperatures require longer reaction times. The reaction is typically stopped after 20 to 30% of the monomers have reacted. This limitation is done to ensure a narrow molecular weight dispersivity. This degree of completion generally occurs in a time period in the range 4 to 24 hours for temperatures in the range of 60 to 130 degrees C.

The resolution and sensitivity obtained depend on the average molecular weight (defined by Billmeyer, *Textbook of Polymer Science*, page 6, 1971 J. Wiley & Sons) of the polymer, the distribution of the molecular weight, and the relative proportions of the monomers in the polymer. For sensitivities better than 200 millijoules per cm$^2$, it is generally desirable to employ polymers with molecular weights greater than 50,000, preferably greater than 100,000 and dispersivities below 3.5, preferably below 3. (Dispersivities are defined in Billmeyer, Supra, page 6.) Molecular weights, however, that are larger than 2,000,000 are typically not desirable because the resulting polymer solution used in coating is excessively viscous.

The molecular weight of the polymer is determined by the polymerization reaction temperature, the catalyst, if any, the catalyst concentration, as well as the concentrations of the three monomers that are utilized. These parameters are interrelated and a control sample is utilized to determine the specific conditions necessary to yield a desired molecular weight. However, generally for molecular weight in the desired range, temperatures in the range 60 to 130 degrees C., with free radical initiators such as benzoyl peroxide in a concentration range from 0 to $10^{-3}$ M, and monomers of methyl methacrylate compounds, OBM compounds and acrylonitrile compounds having concentrations in the range 0.5 to 3 M, 0.1 to 1 M, and 0.05 to 1 M, respectively, are employed.

Dispersivity is predominantly dependent on the reaction temperature, the catalyst, if any, and the percentage of the monomers converted into the polymer. To obtain dispersivities in the desired range, the parameter ranges previously discussed in the context of molecular weight and reaction time are employed. A control sample is used to determine the precise conditions needed for a particular desired dispersivity.

As discussed, sensitivity also depends on the relative proportions of the monomers incorporated into the polymer. This proportion is essentially equal to the relative proportion of monomers used in the reaction mixture. (There is a difference between the amount of 2-chloroacrylonitrile in the reaction mixture and in the final polymer. A control sample is used to determine the precise amount of reactants needed to obtain the desired polymer composition given below when 2-chloroacrylonitrile is employed.) Generally, to attain a desirable sensitivity and resolution the mole percent in the final polymer of acrylonitrile compound should be in the range 10 to 30%, preferably 15 to 25%, the mole percent of OBM compound should be in the range 3 to 30%, preferably 9 to 20%, and the remainder should be methyl methacrylate compound. (The addition of other monomers to the three monomers used to form the terpolymer is possible. However, the proportions of the three monomers should not be altered.)

It is possible to mix various additives with the subject polymers before coating the polymers onto a suitable substrate. For example, to increase the sensitivity of the polymers to short wavelength ultraviolet radiation, photosensitizers capable of absorbing UV radiation and transferring energy to the OBM moiety, such as p-t-butylbenzoic acid, are employed. For the subject polymers singlet sensitizers are preferably used, i.e., sensitizers that rely on energy transferred from an excited singlet state are employed. The sensitizers are preferably chosen to absorb in the wavelength region in the short wavelength ultraviolet where the exposing source has useful intensity.

As discussed, the subject photosensitive bodies are useful for obtaining relatively short exposure times for processes that delineate a pattern with short wavelength UV radiation. In such a process, the subject photosensitive bodies are exposed, for example, by directing UV radiation through a suitable mask. Typically, resist thicknesses in the range 0.3 to 1.5 μm are employed. Exposure is continued for a period sufficient to allow, upon development, complete removal of the irradiated regions of the resist layer. In this regard, it is generally desirable that the optical density of the photosensitive polymer on the substrate is not greater than 0.5. Although larger optical densities are not precluded such densities hinder the exposure of the polymer through its thickness since the exposing radiation is predominately absorbed near the surface. To obtain the preferred optical densities, the ratio of monomers discussed in connection with sensitivities is used. After exposure, the resist is developed by treating the photosensitive body with a suitable solvent such as methyl isobutyl ketone or a mixture of methyl isobutyl ketone with 2-propanol. Development is generally complete in a time period of 30 to 120 seconds. Development should not be so long as to significantly thin the unirradiated portions of the resist.

The following examples are illustrative of resists and exposure processes within the subject invention and compare the subject invention with other photosensitive bodies:

EXAMPLE 1

Preparation of 3-oximino-2-butanone methacrylate (OBM)

The monomer 3-oximino-2-butanone methacrylate (OBM) was prepared. This preparation began by cooling to a temperature of 0 degree C. with an ice water bath, a solution of butanedione monoxime (54.5 g) and triethylamine (120 ml) in ether (1000 ml). Approximately 56 ml of methacryloyl chloride in 250 ml of ether was added dropwise under a nitrogen atmosphere over the course of 1 hour. The solution was stirred during this addition and the stirring was continued under nitrogen at 0 degree C. for 3 hours after the addition was completed. The resulting mixture was filtered to remove the solid residues. The solid residues were discarded, and the liquid obtained was transferred to a separatory funnel. Approximately 300 ml of water was added to the separatory funnel and the liquid was agitated. The water and ether phases were separated, the water phase was discarded, and the ether phase was dried over magnesium sulfate for 1 hour. The magnesium sulfate was removed by filtration and the ether solution was evaporated to dryness on a rotary evaporator using water aspirator vacuum. The resulting solid was recrystallized from cyclohexane to yield 45 g of OBM. (The material obtained melted between 38.5 and 39 degrees C.)

EXAMPLE 2

The Preparation of Polymers

Poly(methyl methacrylate) (PMMA) was utilized as obtained from DuPont. This polymer was denominated Elvacite 2010 by DuPont and was a polymer having an average molecular weight of approximately 120,000.

Copolymers of methyl methacrylate and OBM were synthesized. A variety of these copolymers, as listed in Table I, were produced. The following procedure was the same for each copolymer except the relative amounts of the reactants, methyl methacrylate and OBM, were employed as indicated in the table. The following description is for the polymer which contained 87 M percent methyl methacrylate and 13 M percent OBM.

Methyl methacrylate (160 g) and OBM (40 g) were dissolved in approximately 660 ml of toluene. The solution was heated to 60 degrees C. under an argon atmosphere. This argon atmosphere was produced by bubbling argon into the solution. After approximately 1 hour of bubbling argon through the solution, 34 mg of azobisisobutyronitrile was added. The argon atmosphere and the 60 degrees C. temperature were maintained for 24 hours. The argon bubbling and the heating were then terminated. The solution was allowed to cool and then added dropwise to methanol under agitation to precipitate the polymer. This precipitated polymer was separated by filtration. The polymer obtained was dissolved in ethyl acetate and reprecipitated by again adding the solution to methanol and agitating. The polymer was separated by filtration, and air dried.

EXAMPLE 3

Preparation of Terpolymers

The terpolymers were prepared by the same procedure as described for the copolymers. Table I indicates relative ratios of the monomers used in the reactant mixture to produce the various polymers. The following description illustrates the preparation of one of these polymers. The other polymers listed in the table were prepared in the same manner except the proportions of reactants utilized were as indicated in Table I. (In Table I, M refers to methyl methacrylate, OBM refers to 3-oximino-2-butanone methacrylate, and CN refers to methacrylonitrile.)

The reactants employed to produce a terpolymer of 69 M% methyl methacrylate, 16 M% OBM, and 15 M% methacrylonitrile were prepared by first producing an ethyl acetate solution of 130 g of methyl methacrylate, 50 g of OBM, and 20 g of methyacrylonitrile in 400 ml of ethyl acetate. (The same preparation is possible in a similar amount of toluene.) As described in Example 2, after an hour of agitation, 40.4 mg of benzoyl peroxide was added to the solution and the reactants were maintained at 85 degrees C. for 8 hours. The resulting terpolymer was then separated and purified as described in Example 2.

EXAMPLE 4

Preparation and Exposure of Photosensitive Bodies

The polymers listed in Table I were dissolved in methoxyethyl acetate and coated on a substrate and exposed. The sensitivities listed in Table I were obtained by imaging a 1 mm wide slit illuminated by a 1000 W mercury lamp focussed through quartz condenser optics onto the substrate. A series of exposures through this slit onto the substrate were made with each exposure being approximately 1 second longer than the previous one. The sensitivity of the film was assigned to the shortest term exposure that allowed removal of the entire thickness of the coating upon development without significantly thinning the unexposed portion. The absolute sensitivity of some of the polymers, as indicated in Table I, was determined by isolating the 240 nm line from a 1000 W mercury-xenon lamp with a monochromator (resolution of + or −2 nm). This line was focussed onto a 1 mm diameter circular contact mask. The same procedure as used to determine relative sensitivities was followed for determining absolute sensitivities. Average molecular weight ($M_w$) and dispersivities ($M_w/M_n$) were measured by gel permeation chromotography and glass transition temperature ($T_g$) was measured by differential thermal analysis.

In each case, the polymer was coated on either a 2 inch or 3 inch circular substrate. Either a silicon or a silicon dioxide coated silicon substrate was employed. The polymer to be coated was dissolved in methoxyethyl acetate to form a 10% solution. Approximately 2 ml for the 2 inch wafers or 3 ml for the 3 inch wafers was placed onto the substrate. The substrate was then spun at 3000 rpm for 45 seconds. The resulting coated substrate was baked at 120 degrees C. for 1 hour in an air oven. After exposure as described above, the photosensitive body was developed. This development was done by immersing the exposed body in an appropriate solvent. Methyl isobutyl ketone was employed for the copolymer, a mixture of methyl isobutyl ketone and 2-propanol (80/20) was employed for the terpolymers, and methyl isobutyl ketone was utilized for the poly(methyl methacrylate). Immersion in a solvent was done for approximately 1 minute and then the photosensitive bodies were dried in air at room temperature.

TABLE I

| Polymer | Molar Composition | $M_w$ ($\times 10 + 5$) | Mw/Mn | Tg($-°$C.) | Relative Exposure Required[1] 200–400 nm |
|---|---|---|---|---|---|
| PMMA[c] | — | — | — | 105 | 1(3400) |
| GROUP I | | | | | |
| P(M-OBM) | 97:3 | 1.39 | 2.06 | 103 | 0.40 |
| P(M-OBM) | 94:6 | 2.87 | 1.86 | 103 | 0.25(800) |
| P(M-OBM) | 91:9 | 6.50 | 2.17 | — | 0.25(700) |
| P(M-OBM) | 87:13 | 2.05 | 2.09 | — | 0.025 |
| P(M-OBM) | 84:16 | 2.48 | 2.04 | 95 | 0.033(150) |
| P(M-OBM) | 63:37 | 1.88 | 2.35 | 89 | 0.02 |
| GROUP II | | | | | |
| P(M-OBM-CN) | 86:6:8 | 1.82 | 2.60 | 103 | 0.25 |
| P(M-OBM-CN) | 79:6:15 | 3.41 | 2.66 | 99 | 0.1 |
| P(M-OBM-CN) | 73:6:22 | 2.70 | 2.53 | — | 0.1 |
| P(M-OBM-CN) | 66:6:28 | 1.40 | 2.30 | — | 0.2 |
| GROUP III | | | | | |
| P(M-OBM-CN) | 82:3:15 | 2.06 | 1.84 | 100 | 0.33 |
| P(M-OBM-CN) | 79:6:15 | 3.41 | 2.66 | 99 | 0.1(300) |
| P(M-OBM-CN) | 76:9:15 | 2.27 | 2.19 | 98 | 0.017 |
| P(M-OBM-CN) | 73:12:15 | 2.97 | 1.92 | 95 | 0.017 |
| P(M-OBM-CN) | 69:16:15 | 2.78 | 1.98 | 96 | 0.012(40) |
| P(M-OBM-ClCN)[2] | (70:25:5) | — | — | — | 0.012 |

[1]( ) = absolute sensitivity as measured at 240 nm in mJ/cm$^2$
[2]Terpolymer of methyl methacrylate - OBM and α-chloroacrylonitrile

EXAMPLE 5

Preparation and Exposure of Polymers with Sensitizers

The polymers indicated in Table II were prepared as described in Example 3. As indicated, compositions both with and without a sensitizer were produced. The compositions with a sensitizer were made as described in Example 4, except after purification of the polymer and upon preparation of a solution for spinning approximately 15 weight percent of p-t-butylbenzoic acid was added. The remaining procedure, including exposure and development, was the same.

TABLE II

| Polymer | Composition | % Sensitizers | Sensitivity[1] |
|---|---|---|---|
| P(M-OBM-CN) | 86:6:8 | — | 0.25 |
| P(M-OBM-CN) | 86:6:8 | 15 | 0.017 |
| P(M-OBM-CN) | 79:6:15 | — | 0.1 |
| P(M-OBM-CN) | 79:6:15 | 15 | 0.008 |
| P(M-OBM-CN) | 73:6:22 | — | 0.1 |
| P(M-OBM-CN) | 73:6:22 | 15 | 0.012 |
| P(M-OBM-CN) | 66:6:28 | — | 0.2 |
| P(M-OBM-CN) | 66:6:28 | 15 | 0.033 |

[1]Exposure required relative to PMMA, where PMMA = 1

What is claimed is:

1. A photosensitive body comprising a substrate in contact with a photosensitive material comprising an organic polymer characterized in that said polymer is formed from the monomers comprising (1) a methacrylate ester compound represented by the formula

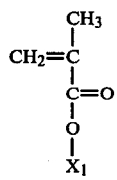

where $X_1$ is an alkyl, (2) a 3-oximino-2-butanone methacrylate based compound represented by the formula

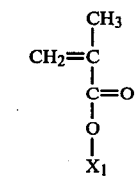

where $R_1$ is chosen from the group consisting of methyl, ethyl, and propyl, $R_2$ is chosen from the group consisting of methyl, ethyl and propyl or $R_1$ and $R_2$ are connected to form a 5 or 6 member ring, and (3) an acrylonitrile based compound represented by the formula

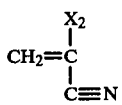

where $X_2$ is $CH_3$ or Cl.

2. The photosensitive body of claim 1 wherein said substrate comprises silicon.

3. The photosensitive body of claim 1 wherein said photosensitive material includes a sensitizer.

4. The photosensitive body of claim 3 wherein said sensitizer comprises p-t-butylbenzoic acid.

5. The photosensitive body of claim 1 wherein said polymer has a molecular weight in the range 50,000 to 2,000,000.

6. The photosensitive body of claim 5 wherein said molecular weight is in the range 100,000 to 2,000,000.

7. The photosensitive body of claim 1 wherein $X_1$ is methyl.

8. The photosensitive body of claim 1 wherein said polymer has a mole percent of said acrylonitrile compound in the range 10 to 30% and a mole percent of said 3-oximino-2-butanone methacrylate compound in the range 3 to 30%.

9. The photosensitive body of claim 8 wherein said mole percent of said acrylonitrile compound is in the range 15 to 25%.

10. The photosensitive body of claim 8 wherein said mole percent of said 3-oximino-2-butanone methacrylate compound is in the range 9 to 20%.

* * * * *